US009475229B2

United States Patent
Iida et al.

(10) Patent No.: US 9,475,229 B2
(45) Date of Patent: Oct. 25, 2016

(54) RESIN PRODUCTION METHOD AND RESIN PRODUCTION APPARATUS

(71) Applicant: CANON KABUSHIKI KAISHA, Tokyo (JP)

(72) Inventors: Kenichi Iida, Kawasaki (JP); Toshiki Ito, Kawasaki (JP); Naoko Matsufuji, Yokohama (JP); Tatsuya Suzuki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/402,962

(22) PCT Filed: Jul. 17, 2013

(86) PCT No.: PCT/JP2013/069964
§ 371 (c)(1),
(2) Date: Nov. 21, 2014

(87) PCT Pub. No.: WO2014/017505
PCT Pub. Date: Jan. 30, 2014

(65) Prior Publication Data
US 2015/0140227 A1    May 21, 2015

(30) Foreign Application Priority Data

Jul. 24, 2012  (JP) ................................ 2012-163718

(51) Int. Cl.
*B29C 59/02* (2006.01)
*G03F 7/00* (2006.01)
(Continued)

(52) U.S. Cl.
CPC ........... *B29C 59/026* (2013.01); *G03F 7/0002* (2013.01); *G03F 7/027* (2013.01); *B29K 2105/0002* (2013.01)

(58) Field of Classification Search
CPC .... B29C 59/029; G03F 7/0002; G03F 7/027
See application file for complete search history.

(56) References Cited

U.S. PATENT DOCUMENTS 7,625,513 B2    12/2009  Yu
7,785,091 B2 *  8/2010  Kasumi ................ B29C 59/022
                                                425/149
(Continued)

FOREIGN PATENT DOCUMENTS

JP        2006-137019 A      6/2006
JP        2006-148055 A      6/2006
(Continued)

OTHER PUBLICATIONS

Ito et al., U.S. Appl. No. 14/349,941, filed Apr. 4, 2014.
(Continued)

*Primary Examiner* — Dah-Wei D Yuan
*Assistant Examiner* — Kristen A Dagenais
(74) *Attorney, Agent, or Firm* — Fitzpatrick, Cella, Harper & Scinto (57) ABSTRACT

Provided is a resin production method in which a mold release force applied between a mold and a curable resin is reduced in a resin production method using a nano-imprint method. The resin production method includes an arrangement step of arranging a curable composition (1) on a substrate (2); a contacting step of bringing a mold (3) into contact with the curable composition (1); a curable composition curing step of curing the curable composition (1) by irradiating the curable composition (1) with a radiation or heating the curable composition (1) while keeping the curable composition (1) in contact with the mold (3); a tensile stress generation step of generating a tensile stress (6) in a direction of spacing the substrate (2) and the mold (3) away from each other to such a degree that the mold (3) and the curable composition (1) are not spaced away from each other when the curable composition (1) is cured; and a mold release step of releasing the curable composition (1) and the mold (3) from each other.

11 Claims, 2 Drawing Sheets

(51) Int. Cl.
*G03F 7/027* (2006.01)
*B29K 105/00* (2006.01)

(56) References Cited

U.S. PATENT DOCUMENTS

| | | | |
|---|---|---|---|
| 8,419,995 B2 | 4/2013 | Yoneda et al. | |
| 8,834,769 B2 | 9/2014 | Korenaga | |
| 2006/0076717 A1* | 4/2006 | Sreenivasan | B81C 1/0046 264/494 |
| 2010/0044898 A1 | 2/2010 | Yamada et al. | |
| 2010/0248163 A1 | 9/2010 | Ito | |
| 2011/0159189 A1 | 6/2011 | Ito et al. | |
| 2011/0180965 A1 | 7/2011 | Zhang et al. | |
| 2013/0092326 A1* | 4/2013 | Goto | C09J 4/00 156/712 |
| 2014/0363584 A1 | 12/2014 | Suzuki et al. | |
| 2015/0050426 A1 | 2/2015 | Ito et al. | |
| 2015/0210790 A1 | 7/2015 | Ito et al. | |

FOREIGN PATENT DOCUMENTS

| | | |
|---|---|---|
| JP | 2006-289505 A | 10/2006 |
| JP | 2007-329367 A | 12/2007 |
| JP | 2008-006704 A | 1/2008 |
| JP | 2010-103464 A | 5/2010 |
| JP | 2010-232356 A | 10/2010 |
| JP | 2010-262980 A | 11/2010 |
| JP | 2011-086727 A | 4/2011 |
| JP | 2012-213889 A | 11/2012 |
| JP | 2013-128078 A | 6/2013 |
| WO | 2008/099795 A2 | 8/2008 |
| WO | 2013/062068 A1 | 5/2013 |
| WO | 2013094660 A1 | 6/2013 |
| WO | 2014/046304 A1 | 3/2014 |

OTHER PUBLICATIONS

Ito et al., U.S. Appl. No. 14/419,382, filed Feb. 3, 2015.
First Office Action in Chinese Application No. 201380038725.3 (issued Nov. 30, 2015).
Extended European Search Report in European Application No. 13823856.3 (dated Jan. 28, 2016).
Notice of Preliminary Rejection in Korean Application No. 10-2015-7003122 (mailed May 31, 2016).

* cited by examiner

RESIN PRODUCTION METHOD AND RESIN PRODUCTION APPARATUS

TECHNICAL FIELD

The present invention relates to a resin production method, in particular, a resin production method using a nano-imprint method, and a resin production apparatus used upon utilization of the production method.

BACKGROUND ART

Semiconductor integrated circuits are being miniaturized and integrated. As a pattern formation technology which is one of the fine processing technologies for realizing the miniaturization and the integration, there is given a photolithography process. In recent years, the precision of semiconductor integrated circuits has been increased through use of the photolithography process. However, as the processing precision to be required is approaching a diffraction limit of exposure light, the photolithography technology is also coming close to a limit. Then, as a method of realizing further miniaturization and higher precision, a nano-imprint method has been proposed. The nano-imprint method involves applying a resin to be cured with heat or light to a substrate to form a thin film, pressing a mold having a fine depressed and projected pattern onto the thin film, and irradiating the thin film with light or subjecting the thin film to a heat treatment, thereby forming a resin with the depressed and projected pattern of the mold transferred thereto. Note that, as a method of curing a thin film formed on a substrate, there are given a radiation curing method using a radiation such as light, a thermal curing method using heat, and the like.

Incidentally, the nano-imprint method has various problems to be solved while being capable of forming a resin having a fine pattern. One of the problems resides in that a force required for releasing a mold from a cured resin, that is, a mold release force is large. When the mold release force is large, there arise problems such as the occurrence of pattern defects and the degradation in positioning accuracy caused by lifting up of a substrate from a stage.

Under the above-mentioned circumstances, there have been several proposals for solving the above-mentioned problems. For example, Patent Literature 1 proposes a procedure in which a gas generating agent for generating a gas with light or heat is contained in a curable resin. This procedure reduces a mold release force by generating a gas from the curable resin. Further, Patent Literature 2 proposes a procedure for reducing a mold release force by using a photocurable resin which generates a gas with light; and changing a generation amount of a gas through use of a light irradiation amount and pressure to be applied to the photocurable resin. Further, Patent Literature 3 discloses an imprint apparatus capable of reducing pattern defects by applying, when releasing a resist from a mold, a mold release force to the mold in advance to reduce a variation in the mold release force.

CITATION LIST

Patent Literature

PTL 1: Japanese Patent Application Laid-Open No. 2010-262980
PTL 2: Japanese Patent Application Laid-Open No. 2010-103464
PTL 3: Japanese Patent Application Laid-Open No. 2011-86727

SUMMARY OF INVENTION

Technical Problem

However, according to the procedure disclosed in Patent Literature 1, a gas generation period is not clarified, and hence the generation of a gas stops in some cases when a cured product is released from a mold. In such a case, it cannot be said that a mold release force is reduced sufficiently. Further, according to the procedure disclosed in Patent Literature 2, the light irradiation amount and pressure to be applied to the photocurable resin are merely auxiliary means for promoting the generation of a gas, and hence it cannot be said that a mold release force is reduced sufficiently by this procedure in the same way as in Patent Literature 1. Further, the apparatus disclosed in Patent Literature 3 is merely capable of controlling the vibration caused by driving of a stage, and Patent Literature 3 does not clarify a mold release force to be applied to the mold. Therefore, it cannot be said that a mold release force is reduced sufficiently in the apparatus disclosed in Patent Literature 3.

The present invention has been made so as to solve the above-mentioned problems, and it is an object of the present invention to provide a resin production method using a nano-imprint method in which a mold release force to be applied between a mold and a curable resin is reduced.

Solution to Problem

A first aspect of a resin production method of the present invention is a resin production method for producing a resin having a predetermined pattern by curing a radiation curable composition while keeping a mold having a predetermined depressed and projected pattern on a surface thereof and the radiation curable composition in contact with each other, the method being characterized by including:
an arrangement step of arranging the radiation curable composition on a substrate;
a contacting step of bringing the mold into contact with the radiation curable composition;
a radiation irradiation step of irradiating the radiation curable composition with a radiation while keeping the radiation curable composition in contact with the mold;
a tensile stress generation step of generating a tensile stress in a direction of spacing the substrate and the mold away from each other to such a degree that the mold and the radiation curable composition are not spaced away from each other when the radiation curable composition is irradiated with the radiation; and
a mold release step of releasing the radiation curable composition and the mold from each other.

In addition, a second aspect of a resin production method of the present invention is characterized by including:
an arrangement step of arranging a heat curable composition on a substrate;
a contacting step of bringing a mold into contact with the heat curable composition;
a heat treatment step of heating the heat curable composition while keeping the heat curable composition in contact with the mold;
a tensile stress generation step of generating a tensile stress in a direction of spacing the substrate and the mold away from each other to such a degree that the mold and the heat curable composition are not spaced away from each other when the heat curable composition is heated; and
a mold release step of releasing the heat curable composition and the mold from each other.

Further features of the present invention will become apparent from the following description of exemplary embodiments with reference to the attached drawings.

BRIEF DESCRIPTION OF DRAWINGS

FIGS. 1A, 1B1, 1B2, 1C1, 1C2, 1D, 1E and 1F are schematic sectional views illustrating a resin production process in a production method of the present invention.

DESCRIPTION OF EMBODIMENTS

Resin Production method

A production method of the present invention is a production method to be employed when producing a resin having a predetermined pattern by curing a curable composition while keeping a mold having a predetermined depressed and projected pattern on a surface thereof and the curable composition in contact with each other. In the present invention, the curable composition is specifically a radiation curable composition which is cured by being irradiated with a radiation and a heat curable composition which is cured by heating the composition itself.

The production method of the present invention includes at least the following steps (1) to (5):
(1) an arrangement step of arranging a curable composition on a substrate;
(2) a contacting step of bringing a mold into contact with the curable composition;
(3) a curing step of curing the curable composition while keeping the curable composition in contact with the mold;
(4) a tensile stress generation step of generating a tensile stress in a direction of spacing the substrate and the mold away from each other to such a degree that the mold and the curable composition are not spaced away from each other during the curing step;
(5) a mold release step of releasing the curable composition and the mold from each other.

In this case, in the case where the curable composition is a radiation curable composition, the curing step is specifically the following step (3a), and the tensile stress generation step is specifically the following step (4a):
(3a) the step of irradiating the radiation curable composition with a radiation while keeping the radiation curable composition in contact with the mold (radiation irradiation step); and
(4a) the step of generating a tensile stress in a direction of spacing the substrate and the mold away from each other to such a degree that the mold and the radiation curable composition are not spaced away from each other when the radiation curable composition is irradiated with the radiation.

Tensile Stress Generation Step

On the other hand, in the case where the curable composition is a heat curable composition, the curing step is specifically the following step (3b), and the tensile stress generation step is specifically the following step (4b):
(3b) the step of heating the heat curable composition while keeping the heat curable composition in contact with the mold (heat treatment step); and
(4b) the step of generating a tensile stress in a direction of spacing the substrate and the mold away from each other to such a degree that the mold and the heat curable composition are not spaced away from each other when the heat curable composition is heated.

An embodiment of the present invention is hereinafter described in detail with reference to the drawings. Note that the present invention is not limited to the embodiment described below and also includes embodiments obtained by appropriately changing the design of the embodiment described below and modifying the embodiment described below based on the ordinary knowledge of those skilled in the art within a range not departing from the spirit of the present invention. Note that the production method of the present invention is preferably a method of producing a resin having formed thereon a pattern with a size of 1 nm to 10 mm, more preferably a method of producing a resin having formed thereon a pattern with a size of 10 nm to 100 μm.

Further, in the present invention, the radiation has a broad concept including light (ultraviolet light, visible light, infrared light) and X-rays without being limited to α-rays, β-rays, γ-rays, and a neutron beam.

FIGS. 1A to 1F are schematic sectional views illustrating a resin production process in the production method of the present invention. Note that the production process illustrated in FIGS. 1A to 1F is a method of producing a resin having a fine pattern using a nano-imprint method. The production method of the present invention is hereinafter described with reference to FIGS. 1A to 1F.

Figure 1A:
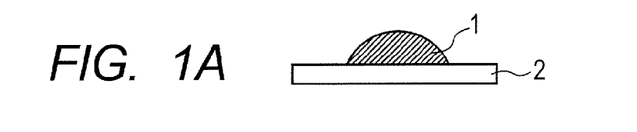

(1) Arrangement Step (FIG. 1A)

First, a curable composition 1 is arranged on a substrate 2 (FIG. 1A). The curable composition 1 can be appropriately selected in accordance with an operation to be performed in a curing step described later. Specifically, in the case where an operation of irradiating the curable composition 1 with a radiation is performed during the curing step, a radiation curable composition which is cured with a radiation is used as the curable composition 1. On the other hand, in the case where an operation of heating the curable composition 1 is performed during the curing step, a heat curable composition which is cured with heat is used as the curable composition 1.

In the present invention, the curable composition is specifically a composition (mixture) represented by the following (1-1) or (1-2):
(1-1) a composition containing a compound which detects at least heat or radiation to effect a polymerization reaction independently; and
(1-2) a composition containing a compound which effects a polymerization reaction at least in the presence of a radical and a cation, and an initiator which generates a radical and a cation with heat or radiation.

Note that the curable composition is not limited to the (1-1) or the (1-2) in the present invention. Further, a solvent may be appropriately added to the composition represented by the (1-1) or (1-2).

Compound which Effects a Polymerization Reaction

As the compound which effects the above-mentioned polymerization reaction, there is given a radically polymerizable monomer or a cationically polymerizable monomer.

A compound having one or more acryloyl groups or methacryloyl groups is preferred as the radically polymerizable monomer. A compound having one or more vinyl ether groups, epoxy groups, or oxetanyl groups is preferred as the cationically polymerizable monomer.

Radically Polymerizable Monomer

Examples of monofunctional (meth)acrylic compounds each having one acryloyl group or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, a (meth)acrylate of p-cumylphenol caused to react with ethylene oxide, 2-bromophenoxyethyl (meth)acrylate, 2,4-dibromophenoxyethyl (meth)acrylate, 2,4,6-tribromophenoxyethyl(meth)acrylate, phenoxy (meth)acrylate modified with multiple moles of ethylene oxide or propylene oxide, polyoxyethylene nonylphenyl ether (meth)acrylate, isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl(meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono (meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products of the monofunctional (meth)acrylic compounds include, but not limited to: Aronix M101, M102, M110, M111, M113, M117, M5700, TO-1317, M120, M150, and M156 (all of the above are manufactured by TOAGOSEI CO., LTD); LA, IBXA, 2-MTA, HPA, and Viscoat #150, #155, #158, #190, #192, #193, #220, #2000, #2100, and #2150 (all of the above are manufactured by OSAKA ORGANIC CHEMICAL INDUSTRY LTD.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of the above are manufactured by KYOEISHA CHEMICAL Co., LTD); KAYARAD TC110S, R-564, and R-128H (all of the above are manufactured by NIPPON KAYAKU Co., Ltd.); NK Ester AMP-10G and AMP-20G (both of the above are manufactured by Shin-Nakamura Chemical Co., Ltd.); FA-511A, 512A, and 513A (all of the above are manufactured by Hitachi Chemical Co., Ltd.); PHE, CEA, PHE-2, PHE-4, BR-31, BR-31M, and BR-32 (all of the above are manufactured by Dai-ichi Kogyo Seiyaku Co., Ltd.); VP (manufactured by BASF); and ACMO, DMAA, and DMA-PAA (all of the above are manufactured by KOHJIN Co., Ltd.), and the like, but are not limited thereto.

Examples of polyfunctional (meth)acrylic compounds each having two or more acryloyl groups or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl) tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercial products of the polyfunctional (meth)acrylic compounds include, but not limited to: Upimer UV SA1002 and SA2007 (both of the above are manufactured by Mitsubishi Chemical Corporation); Viscoat #195, #230, #215, #260, #335HP, #295, #300, #360, #700, GPT, and 3PA (all of the above are manufactured by OSAKA ORGANIC CHEMICAL INDUSTRY LTD.); Light Acrylate 4EG-A, 9EG-A, NP-A, DCP-A, BP-4EA, BP-4PA, TMP-A, PE-3A, PE-4A, and DPE-6A (all of the above are manufactured by KYOEISHA CHEMICAL Co., LTD); KAYARAD PET-30, TMPTA, R-604, DPHA, DPCA-20, -30, -60, and -120, and HX-620, D-310, and D-330 (all of the above are manufactured by NIPPON KAYAKU Co., Ltd.); Aronix M208, M210, M215, M220, M240, M305, M309, M310, M315, M325, and M400 (all of the above are manufactured by TOAGOSEI CO., LTD); and Lipoxy VR-77, VR-60, and VR-(all of the above are manufactured by SHOWA HIGHPOLYMER CO., LTD.).

One kind of those radical polymerizable monomers may be used alone, or two or more kinds thereof may be used in combination. Note that, in the radically polymerizable monomers listed above, the term "(meth)acrylate" is a concept including an acrylate and a methacrylate corresponding thereto. Further, the term "(meth)acryloyl group" is a concept including an acryloyl group and a methacryloyl group corresponding thereto. The EO refers to ethylene oxide, and the EO-modified compound means a compound having in itself a block structure of an ethylene oxide group. Further, the PO refers to propylene oxide, and the PO-modified compound means a compound having in itself a block structure of a propylene oxide group.

Cationically Polymerizable Monomer

Examples of compounds each having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxy polyethylene glycol vinyl ether.

Examples of compounds each having two or more vinyl ether groups include, but not limited to, divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, a bisphenol A alkylene oxide divinyl ether, and a bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

Examples of compounds each having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of compounds each having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-metha-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, a di(3,4-epoxycyclohexylmethyl) ether of ethylene glycol, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of compounds each having one oxetanyl group include, but not limited to, 3-ethyl-3-hydroxymethyloxetane, 3-(meth)allyloxymethyl-3-ethyloxetane, (3-ethyl-3-oxetanylmethoxy)methylbenzene, 4-fluoro[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, and bornyl (3-ethyl-3-oxetanylmethyl) ether.

Examples of compounds each having two or more oxetanyl groups include, but not limited to, polyfunctional oxetanes such as 3,7-bis(3-oxetanyl)-5-oxa-nonane, 3,3'-(1,3-(2-methylenyl)propanediyl bis(oxymethylene)) bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis(3-ethyl-3-oxetanylmethyl) ether, tricyclodecanediyl dimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, and EO-modified bisphenol F (3-ethyl-3-oxetanylmethyl) ether.

One kind of those cationically polymerizable monomers may be used alone, or two or more kinds thereof may be used in combination. It should be noted that in the foregoing, the abbreviation "EO" represents ethylene oxide and the term "EO-modified compound" means a compound having a block structure of an ethylene oxide group. In addition, the abbreviation "PO" represents propylene oxide and the term "PO-modified compound" means a compound having a block structure of a propylene oxide group.

Initiator

As the initiator, in the case where the polymerizable compound is a photocurable compound, a photoradical generator or a photoacid generator is used, and in the case where the polymerizable compound is a heat curable compound, a heat polymerization initiator is used.

Photoradical Generator

The photoradical generator is a compound which causes a chemical reaction, generates a radical, and is capable of initiating radical polymerization through irradiation with a radiation such as charged particle rays including infrared light, visible light, ultraviolet light, far ultraviolet light, X-rays, and electron rays.

Examples of the photoradical generator include, but not limited to, 2,4,5-triarylimidazole dimers which may be substituted such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropyl thioxanthone, and 2-chloro thioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis(2,6-dimethoxybenzoyl)-2,4,4-trimethylpentylphosphine oxide. In addition, one of those compounds may be used alone, or two or more kinds thereof may be used in combination.

Examples of commercial products of the photoradical generator include, but not limited to, Irgacure 184, 369, 651, 500, 819, 907, 784, and 2959, CGI-1700, -1750, and -1850, CG24-61, and Darocur 1116 and 1173 (all of the above are manufactured by Ciba Japan), Lucirin TPO, LR8893, and LR8970 (all of the above are manufactured by BASF), and Ubecryl P36 (manufactured by UCB).

Photoacid Generator

The photoacid generator is a compound which causes a chemical reaction generates an acid, and is capable of initiating cation polymerization through irradiation with a radiation such as charged particle rays including infrared light, visible light, ultraviolet light, far ultraviolet light, X-rays, and electron rays. Examples of such compound include, but not limited to, an onium salt compound, a sulfone compound, a sulfonic acid ester compound, a sulfonimide compound, and a diazomethane compound. In the present invention, it is preferred to use the onium salt compound.

Examples of the onium salt compound include, but not limited to, an iodonium salt, a sulfonium salt, a phosphonium salt, a diazonium salt, an ammonium salt, and a pyridinium salt. Specific examples of the onium salt compound include, but not limited to, bis(4-t-butylphenyl)iodonium perfluoro-n-butanesulfonate, bis(4-t-butylphenyl)iodonium trifluoromethanesulfonate, bis(4-t-butylphenyl) iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl) sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate.

Examples of the sulfone compound can include β-ketosulfone, β-sulfonylsulfone, and α-diazo compounds thereof. Specific examples of the sulfone compound include, but not limited to, phenacyl phenyl sulfone, mesithyl phenacyl sulfone, bis(phenylsulfonyl)methane, and 4-trisphenacyl sulfone.

Examples of the sulfonic acid ester compound can include an alkyl sulfonic acid ester, a haloalkyl sulfonic acid ester, an aryl sulfonic acid ester, and an iminosulfonate. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Specific examples of the sulfonimide compounds include, but not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptan-5,6-oxy-2,3-dicarboximide, N-(trifluoromethylsulfonyloxy)naphthylimide, N-(10-camphorsulfonyloxy)succinimide, N-(10-camphorsulfonyloxy)phthalimide, N-(10- camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptan-5,6-oxy-2,3-dicarboximide, N-(10-camphorsulfonyloxy)naphthylimide, N-(4-methylphenylsulfonyloxy)succinimide, N-(4-methylphenylsulfonyloxyl)phthalimide, N-(4-methylphenylsulfonyloxy)diphenylmaleimide, N-(4-methylphenylsulfonyloxyl)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxyl)bicyclo[2.2.1]heptan-5,6-oxy-2,3-dicarboximide, N-(4-methylphenylsulfonyloxyl)naphthylimide, N-(2-trifluoromethylphenylsulfonyloxy)succinimide, N-(2-trifluoromethylphenylsulfonyloxyl)phthalimide, N-(2-trifluoromethylphenylsulfonyloxy)diphenylmaleimide, N-(2-trifluoromethylphenylsulfonyloxyl)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxyl)bicyclo[2.2.1]heptan-5,6-oxy-2,3-dicarboximide, N-(2-trifluoromethylphenylsulfonyloxyl)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxyl)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxyl)bicyclo[2.2.1]heptan-5,6-oxy-2,3-dicarboximide, and N-(4-fluorophenylsulfonyloxyl)naphthylimide.

Specific examples of the diazomethane compound include, but not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl) (1,1-dimethylethylsulfonyl)diazomethane, and bis(1,1-dimethylethylsulfonyl)diazomethane.

Of those photoacid generators, the onium salt compound is preferred. In the present invention, one kind of the photoacid generators may be used alone, or two or more kinds thereof may be used as a mixture.

Heat Polymerization Initiator

A heat polymerization initiator is selected depending on the curable functional group contained in the compound causing a polymerization reaction. When the curable functional group is a (meth)acryloyl group, a vinyl group, or an allyl group, there are selected, for example, heat radical polymerization initiators typified by:

organic peroxides such as methyl ethyl ketone peroxide, cyclohexanone peroxide, methylcyclohexanone peroxide, methyl acetate peroxide, acetyl acetate peroxide, 1,1-bis(t-butylperoxy)butane, 1,1-bis(t-butylperoxy)-cyclohexane, 1,1-bis(t-butylperoxy)-2-methylcyclohexane, 1,1-bis(t-butylperoxy)-3,3,5-trimethylcyclohexane, 1,1-bis(t-butylperoxy)cyclododecane, 1,1-bis(t-hexylperoxy)-cyclohexane, 1,1-bis(t-hexylperoxy)-3,3,5-trimethylcyclohexane, 2,2-bis(4,4-di-t-butylperoxycyclohexyl)propane, t-butyl hydroperoxide, t-hexyl hydroperoxide, 1,1,3,3-tetramethylbutyl hydroperoxide, cumen hydroperoxide, p-methyl hydroperoxide, diisopropylbenzene hydroperoxide, di-t-butyl peroxide, dicumyl peroxide, t-butyl cumyl peroxide, α,α'-bis(t-butylperoxy)diisopropylbenzene, 2,5-dimethyl-2,5-bis(t-butylperoxy)hexane, 2,5-dimethyl-2,5-bis(t-butylperoxy)hexyne-3, isobutyryl peroxide, 3,3,5-trimethylhexanoyl peroxide, octanoyl peroxide, lauroyl peroxide, stearoyl peroxide, succinic acid peroxide, m-toluoyl benzoyl peroxide, benzoyl peroxide, di-n-propyl peroxydicarbonate, diisopropyl peroxydicarbonate, bis(4-t-butylcyclohexyl) peroxydicarbonate, di-2-ethoxyethyl peroxydicarbonate, di-2-methoxyhexyl peroxydicarbonate, di-3-methoxybutyl peroxydicarbonate, di-S-butyl peroxydicarbonate, di(3-methyl-3-methoxybutyl) peroxydicarbonate, α,α'-bis(neodecanoylperoxy)diisopropylbenzene, t-butyl peroxyneodecanoate, t-hexyl peroxyneodecanoate, 1,1,3,3-tetramethylbutyl peroxyneodecanoate, 1-cyclohexyl-1-methylethyl peroxyneodecanoate, cumyl peroxyneodecanoate, t-butyl peroxypivalate, t-hexyl peroxypivalate, t-butyl peroxy-2-ethylhexanoate, t-hexyl peroxy-2-ethylhexanoate, 1,1,3,3-tetramethylbutyl peroxy-2-ethylhexanoate, 2,5-dimethyl-2,5-bis(2-ethylhexanoylperoxy)hexane, 1-cyclohexyl-1-methylethyl peroxy-2-ethylhexanoate, t-butyl peroxy-3,5,5-trimethylhexanoate, t-butyl peroxyisopropylmonocarbonate, t-hexyl peroxyisopropylmonocarbonate, t-butyl peroxy-2-ethylhexylmonocarbonate, t-butyl peroxyallylmonocarbonate, t-butyl peroxyisobutyrate, t-butyl peroxymaleate, t-butyl peroxybenzoate, t-hexyl peroxybenzoate, t-butyl peroxy-m-toluylbenzoate, t-butyl peroxylaurate, t-butyl peroxyacetate, bis(t-butylperoxy) isophthalate, 2,5-dimethyl-2,5-bis(m-toluylperoxy)hexane, 2,5-dimethyl-2,5-bis(benzoylperoxy)hexane, t-butyltrimethylsilyl peroxide, 3,3',4,4'-tetra(t-butylperoxycarbonyl)benzophenone, and 2,3-dimethyl-2,3-diphenylbutane; and azo compounds such as 1-[(1-cyano-1-methylethyl)azo]formamide, 1,1'-azobis(cyclohexane-1-carbonitrile), 2,2'-azobis(2-methylbutyronitrile), 2,2'-azobisisobutyronitrile, 2,2'-azobis(2,4-dimethyl-4-methoxyvaleronitrile), 2,2'-azobis(2,4-dimethylvaleronitrile), 2-phenylazo-4-methoxy-2,4-dimethylvaleronitrile, 2,2'-azobis(2-methylpropioneamidine) dihydrochloride, 2,2-azobis(2-methyl-N-phenylpropioneamidine) dihydrochloride, 2,2'-azobis[N-(4-chlorophenyl)-2-methylpropioneamidine] dihydrochloride, 2,2'-azobis[N-(4-hydroxyphenyl)-2-methylpropioneamidine]dihydrochloride, 2,2'-azobis[2-methyl-N-(2-propenyl)propioneamidine]dihydrochloride, 2,2'-azobis[N-(2-hydroxyethyl)-2-methylpropioneamidine]dihydrochloride, 2,2'-azobis[2-methyl-N-(phenylmethyl)propioneamidine]dihydrochloride, 2,2'-azobis[2-(2-imidazoline-2-yl)propane]dihydrochloride, 2,2'-azobis[2-(2-imidazoline-2-yl)propane]dihydrochloride, 2,2'-azobis[2-(5-methyl-2-imidazoline-2-yl)propane]dihydrochloride, 2,2'-azobis{2-[1-(2-hydroxyethyl)-2-imidazoline-2-yl]propane}dihydrochloride, 2,2'-azobis[2-(4,5,6,7-tetrahydro-1H-1,3-diazepine-2-yl)propane]dihydrochloride, 2,2'-azobis[2-(3,4,5,6-tetrahydropyrimidine-2-yl)propane]dihydrochloride, 2,2'-azobis[2-(5-hydroxy-3,4,5,6-tetrahydropyrimidine-2-yl)propane]dihydrochloride, 2,2'-azobis(2-methylpropioneamide), 2,2'-azobis[2-methyl-N-(2-hydroxyethyl)propioneamide], 2,2'-azobis[2-methyl-N-[1,1-bis(hydroxymethyl)-2-hydroxyethyl]propioneamide], 2,2'-azobis{2-methyl-N-[1,1-bis(hydroxymethyl)ethyl]propioneamide}, 2,2'-azobis(2-methylpropane), 2,2'-azobis(2,4,4-trimethylpentane), dimethyl 2,2'-azobis(2-methylpropionate), 4,4'-azobis(4-cyanopentanoic acid), and 2,2'-azobis[2-(hydroxymethyl) propionitrile].

When the curable functional group is an epoxy group, there are selected, for example, anionic initiators typified by: imidazoles such as melamine, imidazole, 2-methylimidazole, 2-undecylimidazole, 2-heptadecylimidazole, 2-ethyl-4-ethylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-S-trizaine, 2,4-diamino-6-[2'-undecylimidazolyl-(1')]-ethyl-S-trizaine, 2,4-diamino-6-[2'-ethyl-4'-imidazolyl-(1')]-ethyl-S-trizaine, an isocyanuric acid adduct of 2,4-diamino-6-[2'-methylimidazolyl-(1')]-ethyl-S-trizaine, an isocyanuric acid adduct of 2-phenylimidazole, an isocyanuric acid adduct of 2-methylimidazole, 2-phenyl-4,5-dihydroxymethylimidazole, 2-phenyl-4-methyl-5-hydroxymethylimidazole, 2,3-dihydro-1H-pyrrolo[1,2-a]benzimidazole, 4,4'-methylenebis(2-ethyl-5-methylimidazole), and 1-dodecyl-2-methyl-3-benzylimidazolium chloride;

organic strong bases and salts thereof such as 1,8-diazabicyclo(5.4.0)undecene-7 and salts thereof including a salt of phenol, octylate, p-toluenesulfonate, formate, orthophthalate, and a salt of phenolnovolac resin, and 1,5-diazabicyclo(4.3.0)nonene-5 and a salt of phenolnovolac resin; and ureas such as quaternary phosphonium bromide, an aromatic dimethylurea, and an aliphatic dimethylurea; silanol-based cationic catalysts such as triphenylsilanol; and aluminum chelate-based catalysts such as aluminum tris (acetylacetone).

One kind of those heat polymerization initiators may be used alone, or two or more kinds thereof may be used in combination.

A silicon wafer is generally used as the substrate 2, but in addition to the silicon wafer, there may be used a material arbitrarily selected from any known materials for a substrate of a semiconductor device such as aluminum, a titanium-tungsten alloy, an aluminum-silicon alloy, an aluminum-copper-silicon alloy, silicon oxide, and silicon nitride. Note that, in the case where a resin having a predetermined pattern is produced and then the substrate 2 is processed through use of a processing pattern of the resin, the substrate 2 is sometimes called a substrate to be processed.

The substrate 2 may be subjected to a surface treatment for enhancing adhesion with respect to the curable composition 1. In the present invention, a coating method is adopted as a method of arranging the curable composition 1 on the substrate 2. Specifically, an ink jet method, a dip coating method, an air knife coating method, a curtain coating method, a wire bar coating method, a gravure coating method, an extrusion coating method, a spin coating method, or a slit scan method is adopted.

It should be noted that the thickness of a film formed of the curable composition 1 arranged on the substrate 2 is, for example, 0.01 μm to 100.0 μm, though the thickness varies depending on its applications.

(2) Contacting Step (FIGS. 1B1 and 1B2)

Figure 1B:
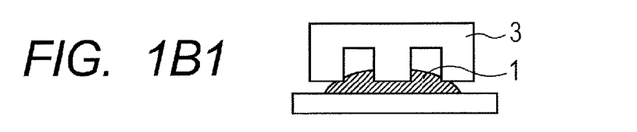
Figure 1B:
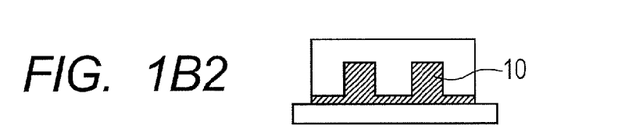

Next, the step (contacting step, FIGS. 1B1 and 1B2) of bringing the mold 3 into contact with a coating film 10 made of the curable composition 1 formed in the previous step (arrangement step) is performed. Note that the mold 3 can be considered as a stamp and hence this step is also referred to as a stamping step. In this step, when the mold 3 is brought into contact with the curable composition 1 (layer onto which a shape is transferred) (FIG. 1B1), (part of) the coating film 10 is filled into a depressed portion of a fine pattern formed on the mold 3 (FIG. 1B2).

The mold 3 to be used in the production method of the present invention may be subjected to a surface treatment for improving releasability between the curable composition 1 and the surface of the mold 3 before use. A method for the surface treatment is as described below. The treatment is performed with, for example, a silicone- or fluorine-based silane coupling agent. Specifically, a commercially available application type mold release agent such as an OPTOOL DSX manufactured by Daikin Industries, Ltd. can be suitably used.

Further, although no particular limitation is imposed on time for performing the contacting step, the time for performing the contacting step is generally 1 to 600 seconds, preferably 1 to 300 seconds, more preferably 1 to 180 seconds, particularly preferably 1 to 120 seconds. When the time for keeping the mold 3 in contact with the curable composition 1 is short, there is a risk in that the coating film 10 of the curable composition 1 is not filled into the depressed portion sufficiently. On the other hand, when the time for keeping the mold 3 in contact with the curable composition 1 is long, the throughput of a production process is reduced.

Further, the contacting step can be performed under any condition of the atmosphere, a reduced-pressure atmosphere, or an inert gas atmosphere. The reduced-pressure atmosphere or the inert gas atmosphere is preferred because the influences of oxygen and moisture on a photo-curing reaction can be prevented. In the case where the contacting step is performed under the inert gas atmosphere, as specific examples of the inert gas to be used, there are given nitrogen, carbon dioxide, helium, argon, various fron gases, or mixed gases thereof. In the case where this step (contacting step) is performed under a particular gas atmosphere including the atmosphere, the pressure is preferably 0.0001 to 10 atmospheres.

(3) Curing Step (FIGS. 1C1 and 1C2)

Next, the coating film 10 in contact with the mold 3 is cured to form a cured product 11 (FIGS. 1C1 and 1C2). Herein, this step is specifically a radiation irradiation step of irradiating the coating film 10 with a radiation 4 or a heating step of heating the coating film 10.

(3-1) Radiation Irradiation Step (FIG. 1C1)

Figure 1C:
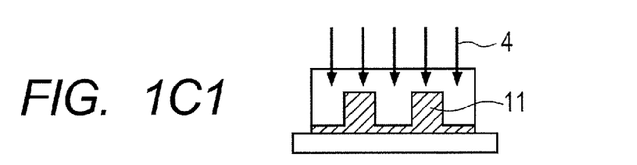

In the case where the curable composition 1 arranged on the substrate 2 is a radiation curable composition, the coating film 10 is irradiated with light such as a radiation through the mold 3 (FIG. 1C1), and thus the curable composition 1 is cured to form the cured product 11.

No particular limitation is imposed on a radiation to be applied, and the radiation is selected depending on the sensitivity wavelength of the radiation curable composition to be used as the curable composition 1. Specifically, it is preferred to appropriately select and use ultraviolet light having a wavelength of about 150 nm to 400 nm, X-rays, or an electron beam. In the case where the radiation curable composition contains an initiator generating a radical or a cation with light, most of such initiators which are easily available have sensitivity with respect to ultraviolet light, and hence it is particularly preferred that the radiation to be used in this step be ultraviolet light. Examples of the light source of ultraviolet light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and an $F_2$ excimer laser. Of those, an ultra-high pressure mercury lamp is particularly preferred. The number of those radiation sources (light sources) to be used may be one or more. Further, the entire surface of the coating film 10 may be irradiated with the radiation, or only a certain region of the coating film 10 may be irradiated with the radiation.

Figure 1C:
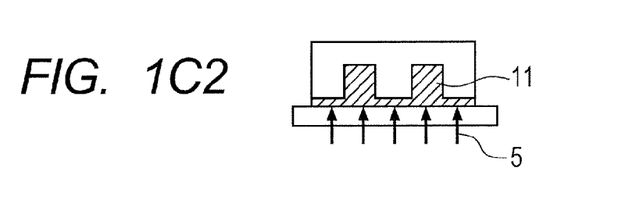

(3-2) Heating Step (FIG. 1C2)

In the case where the curable composition 1 arranged on the substrate 2 is a heat curable composition, heat 5 is applied from the side of the substrate 2 to heat the coating film 10 (FIG. 1C2), and thus the curable composition 1 is cured to form the cured product 11.

Note that, even when the radiation curable composition is used as the curable composition 1, in the case where the radiation curable composition is also cured by heating, the heating step may be performed in addition to or instead of the radiation irradiation step.

On the other hand, even in the case where the heat curable composition is used as the curable composition 1, the radiation irradiation step may be performed in addition to the heating step in order to cure the curable composition 1.

When the heating step is performed, no particular limitations are imposed on heating atmosphere, heating temperature, and the like. For example, the heating step can be performed at 40° C. to 200° C. in an inert gas atmosphere or reduced-pressure atmosphere. Further, a hot plate, an oven, a furnace, or the like can be used as a heating unit to be used for performing this step (heating step).

Figure 1D:
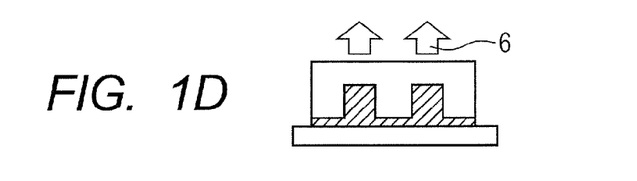

(4) Tensile Stress Generation Step (FIG. 1D)

In the present invention, when the radiation irradiation step or the heating step is performed, the step of applying a force to the mold 3 in a direction of increasing the relative distance between the mold 3 and the substrate 2, that is, a tensile stress generation step is performed (FIG. 1D).

This step is specifically the step of pulling the mold 3 in a direction of increasing the relative distance between the mold 3 and the substrate 2 while preventing the mold 3 and the curable composition 1 from being spaced away from each other. In this case, when the mold 3 is pulled in the direction of increasing the relative distance between the mold 3 and the substrate 2, a tensile stress 6 is generated in the curable composition 1 in contact with the mold 3. As a result, a pressure is generated in the cured product 11 formed of the cured curable composition 1 in a direction in which the substrate 2 and the mold 3 are spaced away from each other. Therefore, a mold release force to be required in a mold release step described later is reduced simultaneously when the cured product 11 is obtained with radiation or heat.

The tensile stress to be required in this step is preferably 0.001 N/mm$^2$ or more and 1.000 N/mm$^2$ or less, more preferably 0.003 N/mm$^2$ or more and 0.600 N/mm$^2$ or less, particularly preferably 0.030 N/mm$^2$ or more and 0.400 N/mm$^2$ or less. In this step, the case where the tensile stress is less than 0.001 N/mm$^2$ is substantially the same as the case where a stress applied to the cured product 11 does not generate a tensile stress during releasing, and thus the effect of reducing a mold release force is not recognized. On the other hand, when the tensile stress is more than 1.000 N/mm$^2$, the following problem arises: part of the cured product 11 is spaced away from the mold 3 to degrade pattern precision.

No particular limitation is imposed on a method of generating a tensile stress, and as described above, a tensile stress can be generated by applying a force in a direction of spacing the mold 3 away from the substrate 2 (pulling the mold 3 in the direction of spacing the mold 3 away from the substrate 2). Alternatively, a force may be applied in a direction of spacing the substrate 2 away from the mold 3 (pulling the substrate 2 in the direction of spacing the substrate 2 away from the mold 3). That is, a tensile stress can be generated by applying a force to the substrate 2 or the mold 3. Further, it is also possible to adopt a method involving applying a force to each of the substrate 2 and the mold 3 (pulling each of the substrate 2 and the mold 3) so that the distance between the substrate 2 and the mold 3 is increased.

Further, in the present invention, the curable composition 1 may contain a gas generating agent which generates a gas with one of radiation and heat. The curable composition 1 containing a gas generating agent advantageously works when a tensile stress is generated in this step (tensile stress generation step). That is, when the curable composition 1 contains a gas generating agent, the mold release force can be reduced by the pressure of a gas generated from the gas generating agent in this step. The effect of reducing the mold release force is enhanced as the gas generation amount is larger.

The generation of a tensile stress may be started simultaneously with the start of the radiation irradiation step or the heating step, or may be started after the start of the radiation irradiation step or the heating step. Preferably, the generation of a tensile stress is started after the start of the radiation irradiation step or the heating step. Note that, when the generation of a tensile stress is started before the start of the radiation irradiation step or the heating step, the curable composition 1 is deformed before being cured, which causes a problem of the degradation in pattern precision.

No particular limitation is imposed on the time when the tensile stress generation step is finished. It is preferred that the tensile stress generation step be performed until the next step (mold release step) is started, and it is more preferred that a tensile stress be continued to be generated even after the start of the next step (mold release step). Note that, when the generation of a tensile stress is stopped before the start of the next step (mold release step), the effect of reducing a mold release force is degraded. The same also applies to the case where the curable composition 1 contains a gas generating agent. Compared to the case where a tensile stress is continued to be applied, a force of spacing the mold 3 away from the cured product 11 caused by the generated gas is dispersed, and hence the effect of reducing a mold release force is degraded.

Figure 1E:
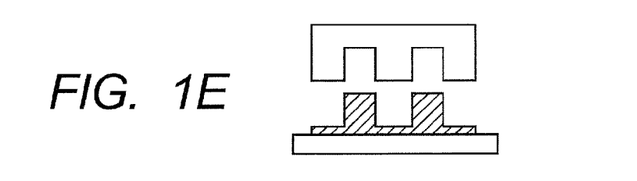

(5) Mold Release Step (FIG. 1E)

Next, the step of releasing the mold 3 from the cured product 11 to form a cured film having a predetermined pattern shape on the substrate 2 (mold release step, FIG. 1D) is performed. This step (mold release step) is the step of releasing the mold 3 from the cured product 11, and the reverse pattern of the fine pattern formed on the mold 3 in the preceding step (curing step) is obtained as the pattern of the cured product 11.

A method of releasing the mold 3 from the cured product 11 is not particularly limited as long as part of the cured product 11 does not physically fracture during the release, and various conditions for the release and the like are also not particularly limited. For example, the mold 3 may be released as described below. The substrate to be processed (substrate 2) is fixed and the mold is moved so that the mold goes away from the substrate to be processed. Alternatively, the mold 3 may be released as described below. The mold 3 is fixed and the substrate to be processed is moved so that the substrate goes away from the mold. Alternatively, the mold may be released by pulling both the substrate and the mold in directions diametrically opposing to each other.

A method involving releasing the mold 3 from the photocured product 11 with a coating type mold release agent can also be adopted. Here, in order that the mold 3 may be released from the photo-cured product 11 with the coating type mold release agent, the step of forming a coating type mold release agent layer on the surface of the mold having a desired pattern is performed in the contacting step.

When the coating type mold release agent is used, examples of the kind thereof, which is not particularly limited, include a silicone-based mold release agent, a fluorine-based mold release agent, a polyethylene-based mold release agent, a polypropylene-based mold release agent, a paraffin-based mold release agent, a montan-based mold release agent, and a carnauba-based mold release agent. It should be noted that one kind of those mold release agents may be used alone, or two or more kinds thereof may be used in combination. Of those, the fluorine-based mold release agent is particularly preferred.

Figure 1F:
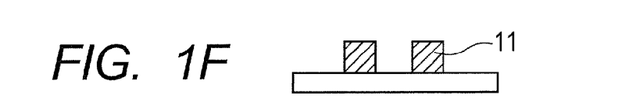

(6) Etching Step (FIG. 1F)

Although the cured product to be obtained when the mold release step is performed has a specific pattern shape, part of the film may exist as a remaining film even in a region except the region where the pattern shape is formed. In view of the foregoing, the step of removing the cured film (remaining film) remaining in a region from which the cured product should be removed in the pattern shape (etching step, FIG. 1F) is performed.

Here, a method of removing the remaining film is, for example, a method involving removing the film (remaining film) remaining in a depressed portion of the cured product 11 by etching to expose the surface of the substrate 2 in the depressed portion of the pattern.

When the etching is utilized, a specific method therefor is not particularly limited and a desired pattern shape can be formed by a conventionally known method, for example, by performing dry etching. A conventionally known dry etching apparatus can be used in the dry etching. In addition, a source gas at the time of the dry etching is appropriately selected depending on the elemental composition of a film to be etched. For example, a gas containing an oxygen atom such as $O_2$, CO, or $CO_2$, an inert gas such as He, $N_2$, or Ar, a chlorine-based gas such as $Cl_2$ or $BCl_3$, or a gas of $H_2$ or $NH_3$ can be used. It should be noted that those gases can be used as a mixture.

The cured product 11 having a desired depressed and projected pattern shape (pattern shape attributable to the depressed and projected shape of the mold 3) can be obtained by the production process including the steps (1) to (6). Here, when the substrate 2 is processed by utilizing the cured product 11, the step of processing the substrate to be described later is further performed in some cases.

Meanwhile, the resultant cured product 11 can be utilized as an optical element (the case where the product is used as a member of the optical element is included). In such case, the cured product 11 can be provided as an optical component having at least the substrate 2 and the photo-cured product 11 arranged on the substrate 2.

(7) Substrate-processing Step

The cured product 11 having a desired depressed and projected pattern shape obtained by the production method of the present invention can be utilized as a film for an interlayer insulating film in an electronic component typified by a semiconductor element such as an LSI, a system LSI, a DRAM, an SDRAM, an RDRAM, or a D-RDRAM. Meanwhile, the photo-cured product 11 can be utilized as a resist film at the time of the production of a semiconductor element.

When the cured product 11 is utilized as a resist film, specifically, part of the substrate whose surface has been exposed by the etching step is subjected to, for example, etching or ion implantation. It should be noted that at this time, the cured product 11 functions as a mask. Thus, a circuit based on the pattern shape of the cured product 11 can be formed on the substrate 2. Thus, a substrate with a circuit to be utilized in a semiconductor element or the like can be produced. It should be noted that an electronic component is formed by providing an electronic member for the substrate with a circuit.

It should be noted that when the substrate with a circuit or the electronic component is produced, the pattern of the photo-cured product may be finally removed from the processed substrate, but such a constitution that the pattern is left as a member for constituting an element is also preferred.

Resin Production Apparatus

Figure 2:
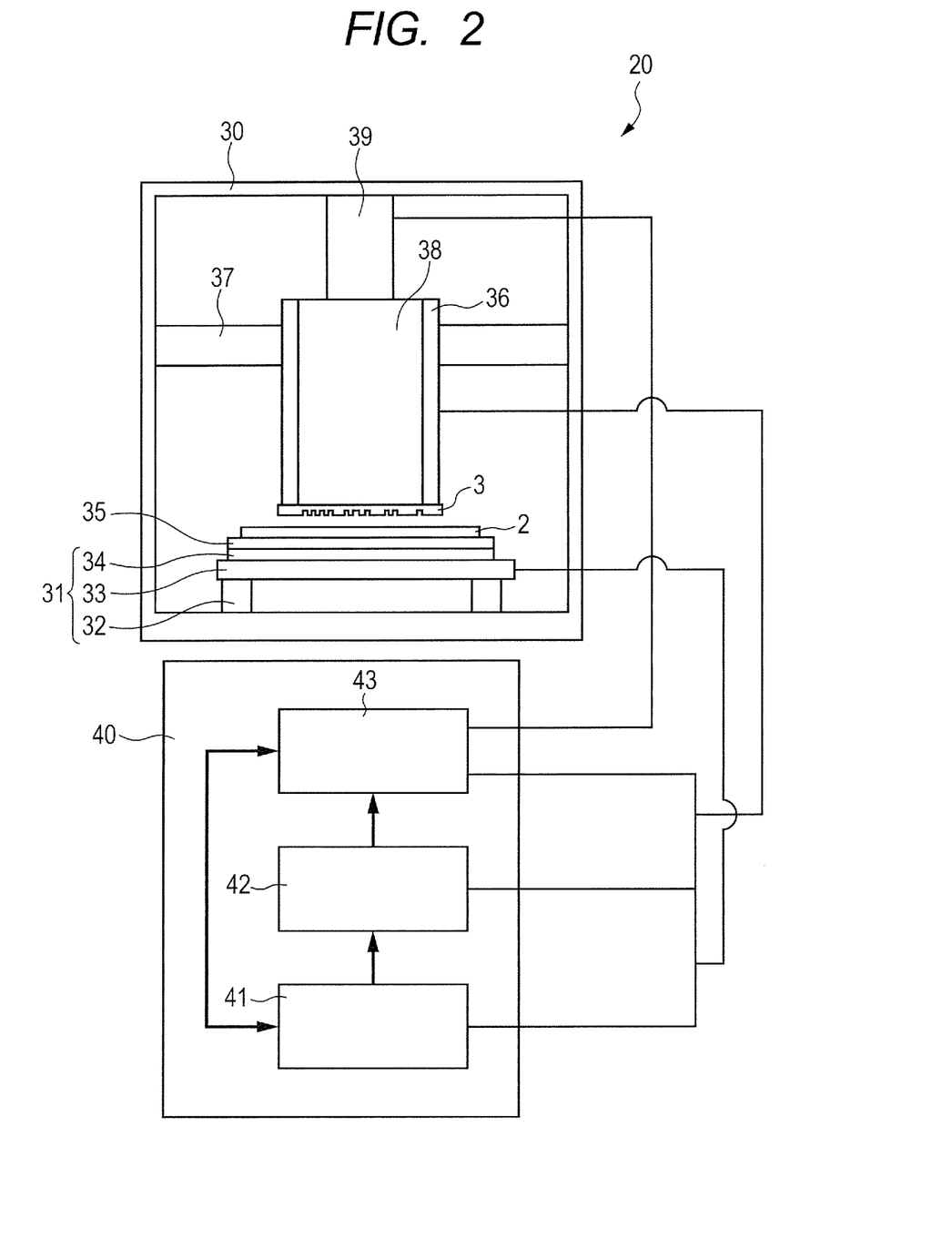
FIG. 2 is a schematic view illustrating an exemplary embodiment of a production apparatus of the present invention.

FIG. 2 is a schematic view illustrating an exemplary embodiment of a production apparatus of the present invention. A production apparatus 20 (imprint apparatus) of FIG. 2 is a production apparatus capable of producing a resin having a predetermined pattern through use of the above-mentioned nano-imprint method.

The production apparatus 20 of FIG. 2 includes a main section 30 serving as a chamber for producing a resin and a controller 40. In the production apparatus 20 of FIG. 2, the main section 30 includes a substrate stage 31 and the mold 3 in the chamber.

The substrate stage 31 is a member including a support section (vibration eliminating controller) 32, and a stage section formed of a Z-tilt stage 33 and an XY-tilt stage 34 provided on the support section 32. In this case, the Z-tilt stage 33 and the XY-tilt stage 34 are stages for controlling the position of the substrate stage 31 and serve as units for bringing a curable composition provided on the substrate 2 and the mold 3 into contact with each other. Further, the Z-tilt stage 33 also includes a unit for generating a tensile stress in a direction of spacing the substrate 2 and the mold 3 away from each other to such a degree that the mold 3 and the curable composition are not spaced away from each other when the curable composition is cured. Note that, considering the characteristics (radiation curing property, heat curing property) of the curable composition, a heating controller 35 serving as a unit for curing the curable composition while keeping the curable composition in contact with the mold 3 may be provided appropriately on the substrate stage 31.

Further, in the production apparatus 20 of FIG. 2, the mold 3 is connected to a mold Z-tilt actuator 36, and the mold Z-tilt actuator 36 is fixed with a fixing shaft 37. In this case, the mold Z-tilt actuator 36 is a stage for controlling the position in a height direction of the mold 3, and includes the following units (a) to (c):

(a) a unit for bringing the mold 3 into contact with the curable composition;

(b) a unit for generating a tensile stress in a direction of spacing the substrate 2 and the mold 3 away from each other to such a degree that the mold 3 and the curable composition are not spaced away from each other when the curable composition is cured; and (c) a unit for releasing the curable composition and the mold 3 from each other.

Note that, considering the characteristics (radiation curing property, heat curing property) of the curable composition, an illumination optical system 38 serving as a unit for curing the curable composition by irradiating the mold 3 with a radiation, for example, light while keeping the curable composition in contact with the mold 3 may be provided appropriately.

Although not shown in FIG. 2, the main section 30 includes a unit for arranging the curable composition on the substrate 2 (for example, a dispenser). Further, in the present invention, units for generating a tensile stress move the relative position of the substrate 2 and the relative position of the mold 3, respectively, to such a degree that the mold 3 and the curable composition are not spaced away from each other. In the production apparatus 20 of FIG. 2, the Z-tilt stage 33 and the mold Z-tilt actuator 36 correspond to the units for generating a tensile stress. Note that, the relative movement of the substrate 2 and the mold 3 has only to be realized, and hence moving units may be provided for both the substrate 2 and the mold 3 or a moving unit may be provided for only one of the substrate 2 and the mold 3.

The controller 40 is a control member including an imprint controller 41, a tensile stress detector 42, and a tensile stress controller 43. The imprint controller 41 is used for controlling the steps included in the resin production process, that is, the contacting step, the curing step, the tensile stress generation step, and the mold release step, respectively. The tensile stress detector 42 is used for receiving a signal output from a stress detector 39 connected to the mold Z-tilt actuator 36, converting the received signal into a signal concerning a tensile stress, and sending the converted signal to the imprint controller 41. Further, the tensile stress controller 43 is provided so as to control the magnitude of a tensile stress based on signals sent from the substrate stage 31, the mold Z-tilt actuator 36, and the imprint controller 41. That is, the controller 40, in particular, the imprint controller 41 and the tensile stress controller 43 each serve as a unit for generating a tensile stress in a direction of spacing the substrate 2 and the mold 3 away from each other to such a degree that the mold 3 and the curable composition are not spaced away from each other when the curable composition is cured. Note that, it is preferred that the stress detector 39 be provided in the main section 30 from the viewpoint of detecting a stress applied to the mold 3 and the curable composition as correctly as possible.

A specific example of a method of actuating the production apparatus of FIG. 2 is described below.

First, in the main section 30, the curable composition is arranged on the substrate 2 through use of the unit for arranging the curable composition on the substrate (for example, a dispenser). Next, the substrate 2 is mounted on the substrate stage 31 through use of a substrate conveyance device (not shown), and the substrate 2 mounted on the substrate stage 31 is moved to a predetermined position through use of the substrate stage 31. Then, the Z-tilt stage 33 and the mold Z-tilt actuator 36 are moved appropriately to bring the curable composition provided on the substrate 2 into contact with the mold 3. Next, the curable composition provided on the substrate 2 is cured through use of one of the heating controller 35 or the illumination optical system 38. Further, when the curable composition is cured, the Z-tilt stage 33 and the mold Z-tilt actuator 36 are moved appropriately to generate a tensile stress. In this case, when the tensile stress is generated, the magnitude of the tensile stress is controlled appropriately by the imprint controller 41 and the tensile stress controller 43 in accordance with a stress exhibited by the tensile stress detector 42. Then, the Z-tilt stage 33 and the mold Z-tilt actuator 36 are moved respectively to release the substrate 2 and the mold 3 from each other. After that, the substrate 2 is moved from the main section 30 to a device for performing an etching step through use of the substrate conveyance device (not shown).

Note that, in the production apparatus 20 of FIG. 2, when the curable composition is arranged on the substrate 2, the substrate 2 may be mounted on the substrate stage 31 in advance.

EXAMPLE

Hereinafter, the present invention is described in detail by way of examples, but the present invention is not limited to the examples to be described below. It should be noted that all the terms "part(s)" and "%" in the following description refer to "part(s) by weight" and "wt %," respectively unless otherwise stated.

Example 1

(1) Curable Composition (Radiation Curable Composition)

A curable composition (radiation curable composition) was prepared by mixing reagents shown below and a solvent.

<Photopolymerizable monomer (note 1)>
trimethylolpropane triacrylate (manufactured by TOAGO-SEI CO., LTD.): 100 parts
<Photopolymerization initiator>Dar.1173 (manufactured by Ciba Japan): 3 parts
<Gas generating agent (note 2)>2,2'-azobis-(N-butyl-2-methylpropioneamide) (trade name: VAm-110, manufactured by Wako Pure Chemical Industries, Ltd.): 15 parts
(Note 1) a polyfunctional (meth)acrylic compound having two or more methacryloyl groups
(Note 2) a gas generating agent producing gas with light
(2) Resin Production Method First, the curable composition prepared as described above was applied to a silicon glass of 100 mm$^2$. Then, a quartz glass (mold having no pattern) of 100 mm$^2$ was held in parallel with the silicon glass, and the curable composition and the quartz glass were brought into contact with each other. In this case, the thickness of a film made of the curable composition was 1 μm. Then, the curable composition was irradiated with light having a wavelength of 365 nm (illuminance: 19.1 mW/cm$^2$) for 20 seconds from the quartz glass side. While the curable composition was irradiated with light (illuminance: 19.1 mW/cm$^2$) having a wavelength of 365 nm, the quartz glass was moved appropriately in a direction of increasing the relative distance between the silicon glass and the quartz glass so that a tensile stress became 0.354 N/mm$^2$. Then, the quartz glass was released from the cured curable composition. Accordingly, a cured resin was obtained. At this time, a mold release force generated when the quartz glass was released from the cured curable composition was measured. Table 1 shows the results.

Example 2

A resin was produced by the same method as that of Example 1 except that the quartz glass was moved appropriately in a direction of increasing the relative distance between the silicon glass and the quartz glass so that a tensile stress became 0.177 N/mm$^2$ in Example 1. Further, a mold release force was measured in the same way as in Example 1. Table 1 shows the results.

Example 3

A resin was produced by the same method as that of Example 1 except that the quartz glass was moved appropriately in a direction of increasing the relative distance between the silicon glass and the quartz glass so that a tensile stress became 0.035 N/mm$^2$ in Example 1. Further, a mold release force was measured in the same way as in Example 1. Table 1 shows the results.

Example 4

A resin was produced by the same method as that of Example 1 except that the quartz glass was moved appropriately in a direction of increasing the relative distance between the silicon glass and the quartz glass so that a tensile stress became 0.004 N/mm$^2$ in Example 1. Further, a mold release force was measured in the same way as in Example 1. Table 1 shows the results.

Comparative Example 1

A resin was produced by the same method as that of Example 1 except that the quartz glass was released from the cured curable composition without applying a tensile stress to the quartz glass after the irradiation with light in Example 1. Further, a mold release force was measured in the same way as in Example 1. Table 1 shows the results.

TABLE 1

| | Tensile stress [N/mm$^2$] | Mold release force [N] | Effect of reducing mold release force [Note 3] |
|---|---|---|---|
| Example 1 | 0.354 | 3.9 | AA |
| Example 2 | 0.177 | 6.4 | AA |
| Example 3 | 0.035 | 29.6 | AA |
| Example 4 | 0.004 | 89.4 | A |
| Comparative Example 1 | 0.000 | >100 | C |

[Note 3]
AA: The mold release force is less than 30 N.
A: The mold release force is 30 N or more and 100 N or less.
C: The mold release force is more than 100 N.

INDUSTRIAL APPLICABILITY

According to the present invention, a resin production method can be provided in which a mold release force applied between a mold and a curable resin is reduced in a resin production method using a nano-imprint method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-163718, filed Jul. 24, 2012, which is hereby incorporated by reference herein in its entirety.

The invention claimed is:

1. A resin production method for producing a resin having a predetermined pattern by curing a radiation curable composition while keeping a mold having a predetermined depressed and projected pattern on a surface thereof and the radiation curable composition in contact with each other, the method comprising:
an arrangement step of arranging the radiation curable composition on a substrate;
a contacting step of bringing the mold into contact with the radiation curable composition;
a radiation irradiation step of irradiating the radiation curable composition with a radiation while keeping the radiation curable composition in contact with the mold;
a tensile stress generation step of generating, while subjecting the radiation curable composition to radiation irradiation, a tensile stress by increasing a relative distance between the mold and the substrate without separating the mold from the radiation curable composition; and
a mold release step of releasing a cured composition and the mold from each other,
wherein the mold release step is started after the tensile stress generation step.

2. The resin production method according to claim 1, wherein the tensile stress is 0.001 N/mm$^2$ to 1.000 N/mm$^2$.

3. The resin production method according to claim 1, wherein the radiation curable composition further comprises a gas generating agent for generating a gas by being irradiated with the radiation.

4. The resin production method according to claim 1, wherein the tensile stress generation step is performed after the radiation irradiation step is started.

5. The resin production method according to claim 1, further comprising a gas generation step of generating a gas by irradiating the radiation curable composition with a radiation having a wavelength different from a wavelength of the radiation used in the radiation irradiation step between the radiation irradiation step and the tensile stress generation step.

6. A resin production method, comprising:
an arrangement step of arranging a heat curable composition on a substrate;
a contacting step of bringing a mold into contact with the heat curable composition;
a heat treatment step of heating the heat curable composition while keeping the heat curable composition in contact with the mold;
a tensile stress generation step of generating, while heating the heat curable composition, a tensile stress by increasing a relative distance between the mold and the substrate without separating the mold from the heat curable composition; and
a mold release step of releasing a cured composition and the mold from each other,
wherein the mold release step is started after the tensile stress generation step.

7. The resin production method according to claim 6, wherein the tensile stress is 0.001 N/mm$^2$ to 1.000 N/mm$^2$.

8. The resin production method according to claim 6, wherein the heat curable composition comprises a gas generating agent that generates a gas by being heated.

9. The resin production method according to claim 1, wherein the radiation irradiation step is a step of curing the radiation curable composition, and the tensile stress generation step is conducted simultaneously with the radiation irradiation step.

10. The resin production method according to claim 1, wherein the generating of the tensile stress is not stopped before starting the mold release step.

11. The resin production method according to claim 6, wherein the generating of the tensile stress is not stopped before starting the mold release step.

* * * * *